US007776445B2

(12) United States Patent
Lee et al.

(10) Patent No.: US 7,776,445 B2
(45) Date of Patent: Aug. 17, 2010

(54) GRAPHENE-DIAMOND HYBRID MATERIAL AND METHOD FOR PREPARING SAME USING CHEMICAL VAPOR DEPOSITION

(75) Inventors: Jae Kap Lee, Seoul (KR); Seung Cheol Lee, Seoul (KR); Phillip John, Edinburgh (GB); Wook Seong Lee, Seoul (KR); Jeon Kook Lee, Seongnam-si (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 12/191,801

(22) Filed: Aug. 14, 2008

(65) Prior Publication Data

US 2009/0047520 A1    Feb. 19, 2009

(30) Foreign Application Priority Data

Aug. 14, 2007    (KR) .................. 10-2007-0081989

(51) Int. Cl.
*B32B 9/00* (2006.01)
*C23C 16/26* (2006.01)
(52) U.S. Cl. .................. 428/408; 427/249.6; 423/448; 977/742
(58) Field of Classification Search .................. 428/408, 428/98, 215; 216/96; 977/742, 755, 775, 977/832; 427/249.6; 117/9; 423/448, 445 B, 423/445 R
See application file for complete search history.

(56) References Cited

FOREIGN PATENT DOCUMENTS

WO    WO 2005084172 A2  *  9/2005

OTHER PUBLICATIONS

Zhao et al., Thermal desorption of hydrogen from carbon nanosheets, Journal of Chemical Physics, 124, May 16, 2006, 194704, pp. 1-6.*
N. Kurihara, et al.: "Epitaxial growth of graphite layer on {111} surface of vapor-deposited diamond," J. Appl. Phys. vol. 69(9), May 1, 1991, pp. 6360-6363.

* cited by examiner

*Primary Examiner*—Timothy M Speer
(74) *Attorney, Agent, or Firm*—Rothwell, Figg, Ernst & Manbeck, P.C.

(57) ABSTRACT

Disclosed herein are a graphene hybrid material and a method for preparing the graphene hybrid material, the graphene hybrid material comprising: a matrix having lattice planes disconnected on a surface thereof; and layers of graphene which are epitaxially grown along the lattice planes disconnected on the surface of the matrix such that the layers of graphene are oriented perpendicularly to the matrix, and which are spaced apart from each other and layered on the matrix in the same shape. The graphene hybrid material can be usefully used in the fields of next-generation semiconductor devices, biosensors, electrochemical electrodes and the like.

12 Claims, 5 Drawing Sheets

GRAPHENE-DIAMOND HYBRID MATERIAL AND METHOD FOR PREPARING SAME USING CHEMICAL VAPOR DEPOSITION

FIELD OF THE INVENTION

The present invention relates to a graphene hybrid material in which graphene is chemically bonded with a matrix, and a method for preparing the graphene hybrid material using a chemical vapor deposition (CVD) method.

BACKGROUND OF THE INVENTION

Graphene is called a single hexagonal carbon layer, that is, a single (0001) plane layer of graphite. It is known that this graphene has more excellent physical properties than a carbon nanotube (CNT).

Generally, graphene is obtained by mechanically detaching it from high crystalline graphite. In this case, it is known that this graphene is detached therefrom using scotch tapes, mechanical methods [B. Z. Jang et al., Nano-scaled Graphite Plates, U.S. Pat. No. 7,071,258 B1] or electrostatic methods [A. N Sidorov et al., Electrostatic Deposition of Graphene, *Nanotechnology* 18 (2007) 135301]. In this case, graphene is obtained in the form of a free-standing film.

Further, there is a method of epitaxially depositing graphene by thermally decomposing single crystal silicon carbide [W. A. d. Heer, Epitaxial Graphene, *Solid State Communication* 143 (2007) 92-100]. In this method, graphene is adhered in parallel on silicon carbide.

In addition to the above, several researchers have reported their research results on "graphene synthesis". However, here, graphene has a structure including several tens to several hundreds layers [Prakash et al., Planar Nano-graphenes from Camphor by CVD, *Chemical Physics Letters* 430 (2006) 56-59]. The graphene having such a structure corresponds to nano-sized graphite rather than graphene.

As such, conventionally, it is impossible to synthesize graphene which is chemically bonded with a matrix (or epitaxially grown) and is vertically oriented on the matrix.

SUMMARY OF THE INVENTION

It is, therefore, an object of the present invention to provide a graphene hybrid material in which graphene is chemically bonded with a matrix (or epitaxially grown) and is vertically oriented on the matrix.

Another object of the present invention is to provide a method for preparing the graphene hybrid material using a chemical vapor deposition (CVD) method.

In order to accomplish the above objects, in accordance with a preferred embodiment of the present invention, there is provided a graphene hybrid material, comprising: a matrix having lattice planes disconnected on a surface thereof; and layers of graphene which are epitaxially grown along the lattice planes disconnected on the surface of the matrix such that the layers of graphene are oriented perpendicularly to the matrix and which are spaced apart from each other and layered on the matrix in the same shape.

In accordance with another preferred embodiment of the present invention, there is provided a method for preparing the graphene hybrid material, comprising: epitaxially growing layers of graphene such that the layers of graphene are vertically oriented to a matrix along lattice planes disconnected on a surface of the matrix using a chemical vapor deposition (CVD) method in which the matrix provided on the surface thereof with the disconnected lattice planes where the layers of graphene are epitaxially grown is brought into contact with hydrocarbon and hydrogen gases.

BRIEF DESCRIPTION OF THE DRAWINGS

The above and other objects and features of the present invention will become apparent from the following description of preferred embodiments given in conjunction with the accompanying drawings, which respectively show.

DETAILED DESCRIPTION OF THE PREFERRED EMBODIMENTS

Figure 1:
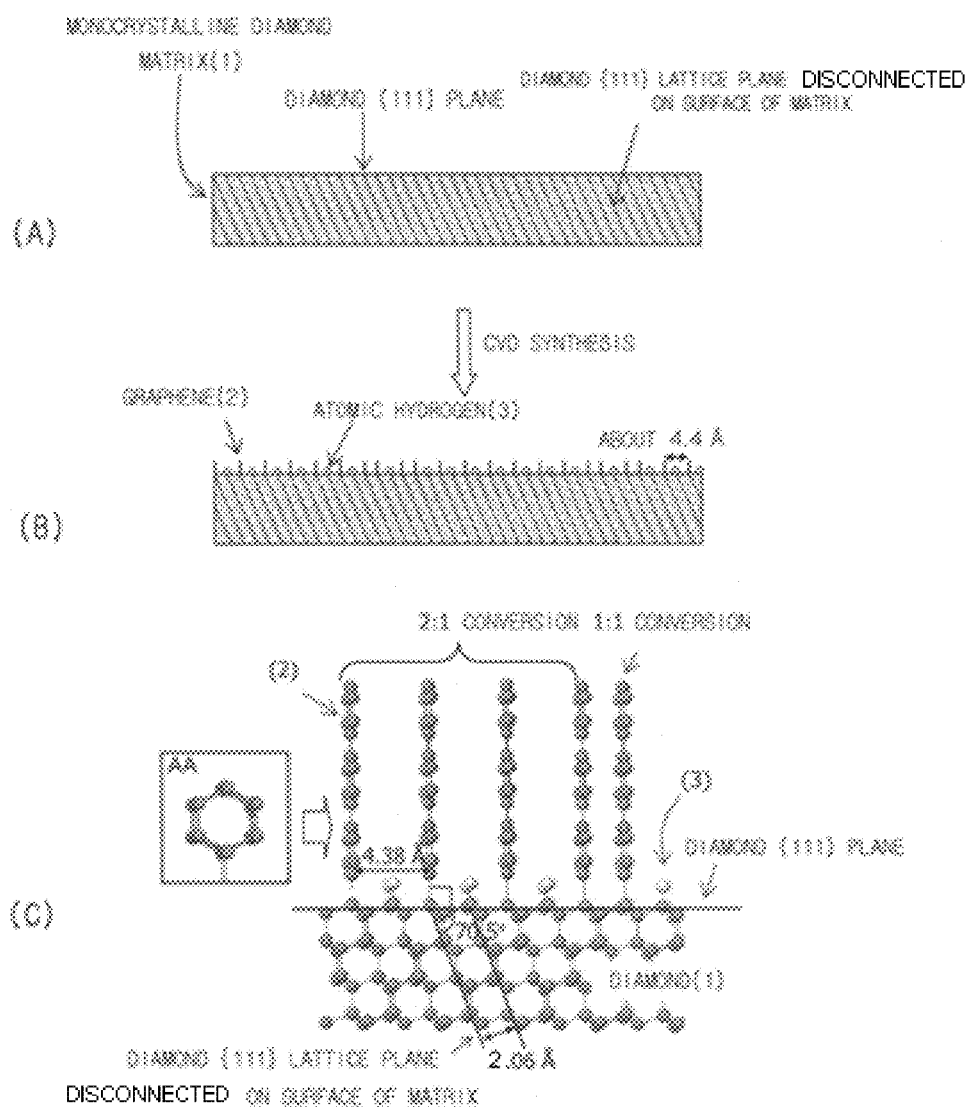
FIG. 1 is a schematic view showing a process of synthesizing layers of graphene which are vertically oriented on a monocrystalline diamond (111) matrix according to an embodiment of the present invention.

Hereinafter, preferred embodiments of the present invention will be described in detail with reference to the attached drawings.

A method of preparing a graphene hybrid material according to the present invention largely includes the steps of: (1) providing a matrix of which crystal planes are controlled; and (2) synthesizing graphene.

Hereinafter, the method for preparing a graphene hybrid material according to the present invention will be described in detail by steps.

<Step of Providing a Matrix of which Crystal Planes are Controlled>

A matrix used in the present invention must be provided on the surface thereof with disconnected lattice planes along which graphene can be epitaxially grown. Examples of the matrix may include monocrystalline or polycrystalline diamond, monocrystalline or polycrystalline cubic boron nitride (cBN), monocrystalline or polycrystalline silicon, and monocrystalline or polycrystalline silicon carbide. This matrix has disconnected {111} lattice planes on the surface thereof. Further, ceramic materials such as alumina ($Al_2O_3$), aluminum nitride (AlN), gallium arsenide (AsGa) and the like, and metals such as copper (Cu), tungsten (W), molybdenum (Mo), tantalum (Ta), iron (Fe) and the like, may also be used as the matrix.

The matrix may be a free-standing film or a film coated on a substrate (for example, a silicon substrate, a ceramic substrate or a metal substrate). The coating of the film on the substrate may be performed by conventional coating methods, for example, a conventional chemical vapor deposition (CVD) method. A diamond matrix may be obtained by coating a substrate with diamond using a conventional CVD diamond synthesis method.

A {111} plane of diamond and graphene, i.e., a (0001) plane of graphite both have a hexagonal structure, and the difference in interatomic distance of lattices between the {111} plane of diamond and graphene is only 2% (diamond: 1.45 Å, graphene: 1.42 Å), and, therefore, the epitaxial growth between these two lattices may be very easy (up to date, direct observation for this fact has not been conducted, and, in the present invention, this fact is verified through transmission electron microscope (TEM) observation).

Examples of commonly-used diamond film include monocrystalline diamond film (size: several millimeters) formed by a high temperature and pressure growth method and polycrystalline diamond film (diameter: about 8 inches) (hereinafter, referred to as "a CVD diamond film") formed by a chemical vapor deposition (CVD) synthesis method. In all cases, in the present invention, disconnected {111} lattice planes along which graphene can be epitaxially grown should be present on the surface of a diamond matrix (refer to FIG. 1C).

Here, the term "disconnected {111} lattice plane" means that a {111} lattice plane which exists in a matrix is disconnected on the surface of the matrix. That is, the disconnected {111} lattice plane is distinguished from the surface of the matrix.

In the case of monocrystalline diamond in which the surface of a matrix is a (111) plane, the {111} lattice planes disconnected on the (111) plane, the surface of the matrix, crystallographically exist in three types of ($\bar{1}$11), (1$\bar{1}$1) and (11$\bar{1}$). As shown in FIG. 1C, one among them meets with the (111) plane at an angle of 70.5°. In the present invention, for the convenience of discernment, the surface of the matrix is designated as the (111) plane, and the lattice plane disconnected on the surface of the matrix is designated as the {111} plane.

A polycrystalline diamond film applied on a substrate, i.e., a CVD diamond film, may include a micron-sized crystalline diamond film having crystallinity and a nanocrystalline diamond film having no crystallinity. Generally, the surface of the CVD diamond film is a (111) or (100) plane, and, when crystal grains are twinned, a (110) plane may appear. In the case of the micron-sized crystalline diamond film, the (111) and (100) planes are clearly distinguished from each other in a scanning electron microscope (SEM) image. In contrast, in the case of the nanocrystalline diamond film, since nano-sized crystal grains appear, the (111) and (100) planes are not distinguished from each other in an SEM image, but nano-sized {111} lattice planes are entirely uniformly distributed.

Therefore, when the nanocrystalline diamond film applied on a silicon substrate is used as a matrix, graphene can be uniformly synthesized on nanoscales throughout the surface of the matrix. Moreover, since the nanocrystalline diamond film is deposited on a silicon substrate at a low thickness of several micrometers (µm) or less, it is preferred in terms of the manufacturing cost.

<Step of Synthesizing Graphene>

According to the present invention, the targeted matrix-graphene hybrid material can be obtained by epitaxially growing layers of graphene such that the layers of graphene are vertically oriented to a matrix along disconnected lattice planes of the surface of the matrix using a chemical vapor deposition (CVD) method in which the matrix provided on the surface thereof with the disconnected lattice planes where the layers of graphene can be epitaxially grown is brought into contact with hydrocarbon and hydrogen gases.

The synthesis of graphene according to the present invention may be performed through a CVD method of synthesizing carbon materials such as carbon nanotubes, graphite nanoflakes, diamond and the like. In accordance with the CVD method of synthesizing carbon materials, nanostructured carbon materials are deposited on a matrix by activating hydrocarbon (for example, methane) and hydrogen gases in a CVD synthesis reactor using plasma or heat and then bringing the activated hydrocarbon-hydrogen gases into contact with the heated matrix.

Among the carbon materials, the condition for synthesizing carbon nanomaterials such as carbon nanotubes and graphite nanoflakes having a graphite phase is different from that for synthesizing diamond having a diamond phase. In the present invention, graphene can be synthesized under either of the two conditions.

In the case of synthesis of the carbon nanomaterials according to the present invention, the synthesis temperature is 350~900° C., preferably 500~800° C., and the synthesis pressure is 1 mTorr~760 Torr, preferably 10 mTorr~40 Torr. Although the carbon nanomaterials can also be synthesized under atmospheric pressure (760 Torr), when the pressure increases, there is a problem that plasma volume is decreased, and thus synthesis area is decreased. For this reason, generally, the carbon nanomaterials are synthesized at a low pressure of 10 mTorr~10 Torr.

Meanwhile, in the case of synthesis of the diamond according to the present invention, the energy source and reaction gas used in the synthesis of the diamond is similar to those used in the synthesis of the carbon materials. However, the synthesis temperature is 600-1000° C., preferably 700-900° C., and the synthesis pressure 40-760 Torr, preferably 40-200 Torr. That is, the synthesis temperature and pressure of the diamond are higher than those of the carbon nanomaterials. The diamond can also be synthesized under atmospheric pressure, but is not synthesized at a low pressure of 10 Torr or lower.

Figure 2:
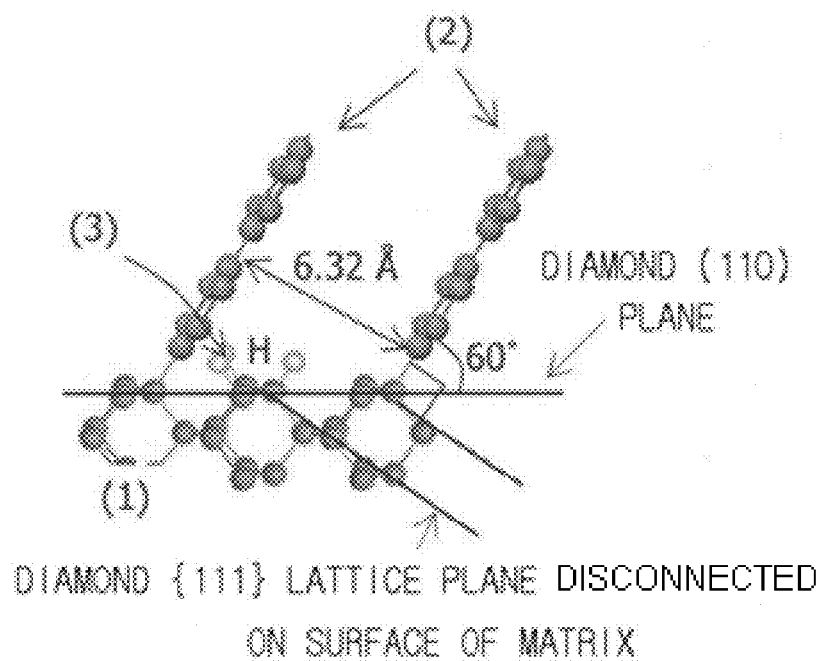
FIG. 2 is a schematic view showing layers of graphene which are formed on a monocrystalline diamond (110) matrix according to another embodiment of the present invention.
Figure 3:
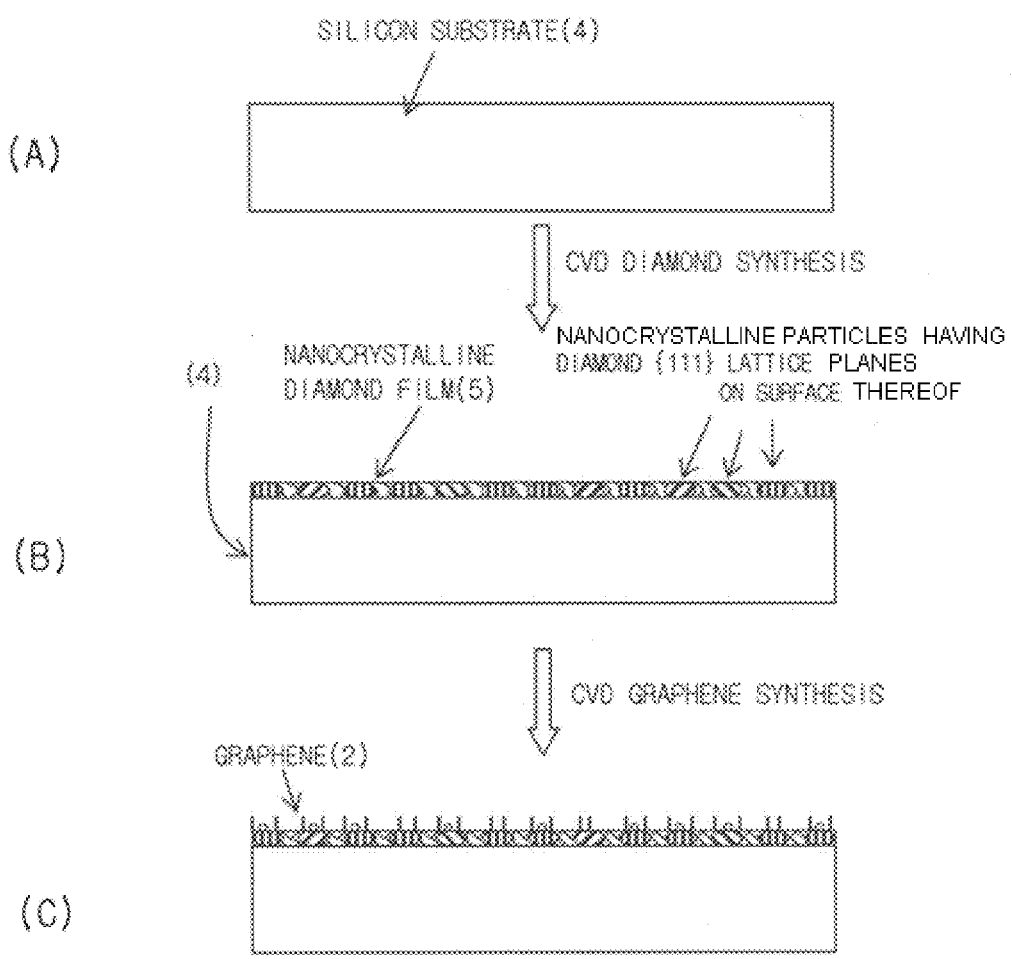
FIG. 3 is a schematic view showing a process of synthesizing layers of graphene on a nanocrystalline CVD diamond film provided on the surface thereof with disconnected {111} lattice planes according to still another embodiment of the present invention.

In the present invention, graphene can be epitaxially grown along the disconnected lattice planes of the surface of the matrix under the synthesis condition of the carbon nanomaterials, and the results thereof are shown in FIGS. 1 to 3.

Referring to FIG. 1, layers of graphene 2 are continuously synthesized on the disconnected {111} lattice planes exposed to the surface of the matrix.

In this case, the layers of graphene are formed while the ratio of diamond {111} lattice plane to graphene maintains 2:1. The reason for this is that the interplanar spacing of the diamond (111) plane, which is 2.06 Å, is about ½ of the ideal interplanar spacing of AB graphite, which is 3.35 Å. In the ratio of diamond {111} lattice plane to graphene of 2:1, the theoretical spacing between layers of graphene on the interface between diamond and graphene is about 4.38 Å. Partially, the ratio of diamond {111} lattice plane to graphene may be 1:1 (interplanar spacing between layers of graphene: 2.19 Å) (see FIG. 1C), which is not shown in FIG. 1B.

Due to the crystallographical symmetry property of diamond and the similarity in the crystal structure between graphene and diamond, when layers of graphene are formed such that the ratio of diamond {111} lattice plane to graphene is 2:1, graphene is designated by an AA layer (see FIG. 1C). The AA layer (crystal space group #191) is distinguished from an AB layer (crystal space group #194), which is a general graphite layer. Atomic hydrogens are bonded on the disconnected diamond {111} lattice planes on which layers of graphene are not grown (see FIGS. 1B and 1C). The ideal distance between the pure AA-layered graphene is about 3.55 Å, and that between the AB-layered graphite is 3.35 Å. Therefore, the distance between the layers of graphene formed on diamond is decreased from 4.38 Å to 3.55 Å as the layers of graphene become more distant from the interface between diamond and graphene. The average distance between graphene layers, which is actually measured at the position spaced apart from the interface between diamond and graphene by several nanometers (nm), is about 3.8 Å.

When silicon is used as a matrix, the interplanar spacing of the silicon {111} lattice plane, which is 3.13 Å, is larger than that of the diamond (111) plane, which is 2.06 Å, and is approximate to the ideal distance of the AB-layered graphite, which is 3.35 Å. Therefore, graphene can be epitaxially grown on the silicon {111} lattice planes such that the ratio of the silicon {111} lattice plane to graphene is primarily 1:1.

Referring to FIG. 2, when the surface of a monocrystalline diamond matrix 1 is a diamond (110) plane, layers of graphene 2 meet with the surface thereof at an angle of 60°. That is, the layers of graphene 2 are perpendicular to a diamond (111) plane (a plane disconnected on the surface thereof) (see FIG. 2A). When the ratio of the diamond (110) plane to graphene is 2:1, the theoretical distance between layers of graphene in the interface between diamond and graphene is 6.32 Å. That is, when graphene is formed on the diamond (110) plane, the maximum distance between layers of graphene in the interface between diamond and graphene is 6.32 Å or less. Even in this case, atomic hydrogens 3 are also bonded on the disconnected diamond {111} lattice planes on which layers of graphene 2 are not grown.

Referring to FIG. 3, a silicon substrate 4 is charged into a CVD synthesis reactor, and then diamond is deposited on the silicon substrate 4 through a chemical vapor deposition method, thus forming a nanocrystalline diamond film 5 thereon. The nanocrystalline diamond film 5 includes innumerable nanocrystalline diamond particles 6 having disconnected {111} lattice planes on the surface thereof in irregular directions (see FIG. 3B). Further, before the deposition of diamond, in order to more easily form the nanocrystalline diamond film 5 on the silicon substrate 4, a pretreatment process of forming scratches or residues on the surface of the silicon substrate 4 may be performed. The pretreatment process comprises immersing the silicon substrate 4 into a solution in which a small amount of diamond powder is dispersed and then vibrating the solution in a ultrasonic bath for a predetermined time.

Subsequently, layers of graphene 2 are epitaxially grown along the disconnected {111} lattice planes of the surface of the nanocrystalline diamond film 5 by changing the CVD synthesis condition into the chemical vapor condition, in which graphite phase is stable, in the same apparatus (see FIG. 3C). For example, after the formation of the nanocrystalline diamond film 5, when the concentration of hydrocarbon gas (for example, methane gas) in the CVD synthesis reactor is increased, the chemical vapor condition in which graphite phase is stable can be formed. Thus, the nanocrystalline diamond film 5 and graphene 2 can be continuously synthesized on the silicon substrate 4. Even in the case, the layers of graphene 2 are deposited along the disconnected {111} lattice planes of the surface of the nanocrystalline particles 6 at regular intervals (may not be necessarily deposited at regular intervals), and atomic hydrogens 3 are bonded on the disconnected diamond {111} lattice planes on which layers of graphene 2 are not grown (see FIG. 3C).

Further, the present invention provides a method of epitaxially growing graphene along the lattice planes of the surface of the matrix under the above diamond synthesis condition.

Figure 4:
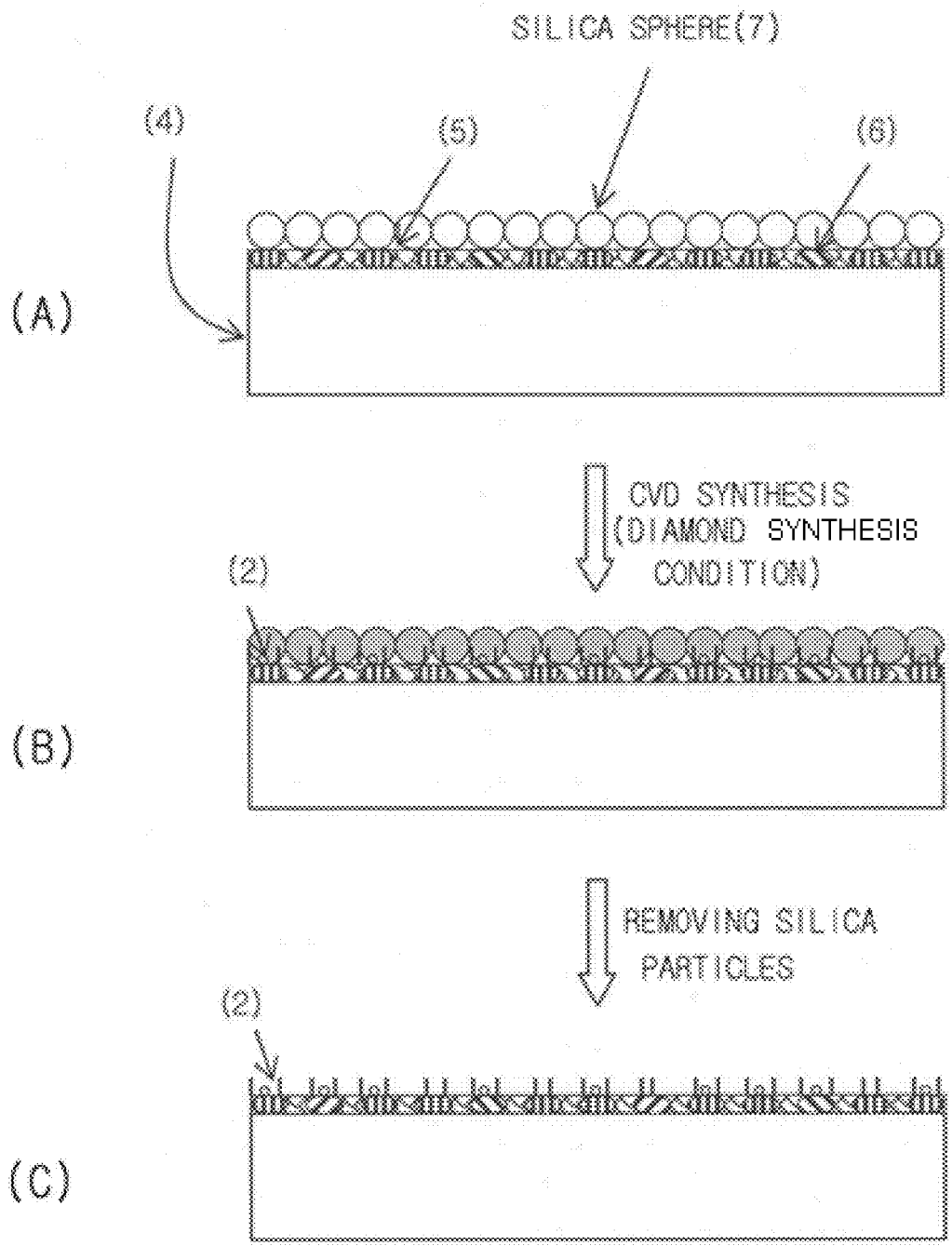
FIG. 4 is a schematic view showing a process of forming a dummy layer of spherical silica particles on a nanocrystalline CVD diamond film and then synthesizing layers of graphene thereon.

First, as shown in FIG. 4, a nanocrystalline diamond film 5 is formed on a silicon substrate 4 through a CVD method. The nanocrystalline diamond film 5 includes innumerable nanocrystalline diamond particles 6 having disconnected {111} lattice planes on the surface thereof in irregular directions (see FIG. 4A). Further, although not shown in drawings, monocrystalline diamond having disconnected {111} planes on the surface thereof may be used as a matrix, or a nanocrystalline diamond film 5 formed on a substrate other than the silicon substrate may be used as the matrix.

Subsequently, the matrix is closely covered with spherical silica particles 7 having a diameter of 1 nm~2 mm, which do not react with the matrix, in a monolayer or multilayer structure (see FIG. 4A). These spherical silica particles are dummy particles for uniformly forming dual chemical vapor condition on the upper and lower surfaces of a silica particle layer. Therefore, irregularly-shaped or hollow particles may be used instead of the spherical silica particles as long as this chemical vapor condition is satisfied. In addition, other particles which do not react with the diamond matrix may be used instead of the silica particles.

Subsequently, the diamond matrix covered with the dummy particle layer is charged into a CVD synthesis reactor, and then hydrocarbon and hydrogen gases, reaction gases, are injected thereto, and then activated, and then a deposition process is performed under the above CVD diamond synthesis condition, and thus layers of graphene 2 are synthesized along the disconnected {111} lattice planes of the surface of the diamond matrix beneath the dummy particle layer (see FIG. 4B).

As such, the reason why graphene 2, which is a graphite phase ($sp^2$ bond structure of carbon), is synthesized under the above CVD diamond synthesis condition is because, due to the dummy particle layer, a diamond film can be deposited on the dummy particle layer, so that, in the space between the diamond film and the diamond matrix, the concentration of atomic hydrogen 3, which is known to be a radical serving to stabilize a diamond phase ($sp^3$ bond structure of carbon), is decreased, and thus the chemical vapor condition in which a graphite phase is stable is formed. In the process of synthesizing the graphene, the diamond film may not be deposited on the dummy particle layer (therefore, the diamond film which can be deposited on silica spheres 7 is not shown in FIG. 4B). For example, when dummy particles having a particle size of several micrometers or less are used, the chemical vapor condition can be obtained without depositing the diamond film thereon.

As described above, the method of synthesizing the graphene using the dummy particle layer under the diamond synthesis condition is advantageous in that the chemical vapor condition for synthesizing the graphene can be uniformly maintained over a large area. Therefore, when this method is used, graphene can be synthesized in a large area of 8 inches in diameter (currently, the size of a commonly-used diamond synthesis apparatus is limited to this size, but the size of the synthesized graphene may be larger than this size) corresponding to the synthesis area of diamond. Even in this case, atomic hydrogens are bonded on the diamond film on which layers of graphene are not grown.

After the synthesis of the graphene, the dummy particle layer which covers the surface of the diamond matrix is naturally separated from the diamond matrix by the low adhesion and difference in thermal expansion coefficient between the dummy particle layer and the diamond matrix. Thus, "a graphene-diamond hybrid material" can be obtained by the removal of the dummy particle layer (see FIG. 4C). When other matrices are used instead of the diamond matrix, graphene-silicon, graphene-silicon carbide and graphene-cubic boron nitride hybrid materials can be variously synthesized.

In order to easily deposit a diamond film on the dummy particle layer, a process of pretreating dummy particles constituting the dummy particle layer may be further performed. That is, the process of pretreating the dummy particles includes the steps of: putting dummy particles into a beaker filled with alcohol in which a small amount of diamond powder having a particle size of several micrometers (μm) is dispersed; vibrating the beaker in an ultrasonic bath for a predetermined time to form scratches or residues on the surface of the dummy particle; sieving the dummy particles; washing the sieved dummy particles with alcohol; and drying the washed dummy particles.

Further, as described above, the chemical vapor condition, in which a graphite phase ($sp^2$ bond structure of carbon) rather than a diamond phase ($sp^3$ bond structure of carbon) is stably formed, is formed beneath the dummy particle layer. Therefore, layers of graphene are formed along the disconnected {111} lattice planes of the surface of the matrix formed beneath the dummy particle layer, and carbon nanomaterials other than the graphene, such as graphite nanoflakes, carbon nanotubes, carbon nanospheres and mixtures thereof, are formed beneath the dummy particles (for example, silica spheres) constituting the dummy particle layer. If the disconnected lattice planes on which graphene can be epitaxially grown are exposed beneath the dummy particles, the graphene can also be formed beneath the dummy particles.

The carbon nanomaterial-dummy particle-diamond film composite formed by depositing the diamond film on the dummy particle layer and depositing the carbon nanomaterials beneath the dummy particle layer is easily separated from the matrix after the synthesis process due to the difference in thermal expansion coefficient between the composite and the matrix. When this composite is immersed into an etching solution which can etch the dummy particles, the etching solution permeates the composite through the lower portions of the dummy particles on which the carbon nanomaterials are not deposited, thereby melting the dummy particles. Therefore, "a carbon nanomaterial-diamond film hybrid material" can be obtained in the form of a free-standing film.

Further, a graphene-matrix hybrid material and a carbon nanomaterial-diamond film hybrid material can be simultaneously obtained through a single process.

The obtained graphene-matrix hybrid material includes a matrix having disconnected lattice planes on the surface thereof, and layers of graphene which are epitaxially grown along the disconnected lattice planes of the surface of the matrix such that the layers of graphene are oriented perpendicularly to the matrix and which are spaced apart from each other and layered (AA-layered) on the matrix in the same shape. The term "AA-layered graphene (space group #191)" means the state in which the shapes of graphene layers are the same as each other and thus hexagonal structures of the graphene layers overlap with each other (see FIG. 1C), and are clearly distinguished from "AB-layered graphites (space group #194)" in which hexagonal structures of the graphite layers do not overlap with each other.

As described above, according to the present invention, layers of graphene are epitaxially grown along the disconnected lattice planes of the surface of the matrix to be oriented perpendicularly to the matrix using a CVD carbon material synthesis method, and the layers of graphene grown in this way can be controlled in a molecular size which corresponds to 1/10 of a nanometer, so that the graphene can exhibit more excellent properties than carbon nanotubes and can be synthesized in a large area of 8 inches or more in diameter.

Therefore, the graphene hybrid material according to the present invention can be usefully used in the application fields of carbon nanotubes, such as biosensors including body-transplanted biochips, next-generation semiconductor devices, electrochemical electrodes and the like. Further, based on the fact that the distance between the layers of graphene is larger by at most 88% than the distance between graphite, the graphene can also be applied to the development of various graphite intercalation compounds (GIC).

Hereinafter, the present invention will be described in more detail with reference to the following Examples. However, since the following Examples are set forth to illustrate the present invention, the spirit and scope of the present invention is not limited thereto.

Example 1

Graphene was synthesized using a method shown in FIG. 1. (110) monocrystalline diamond having {111} lattice planes disconnected on the surface thereof was used as a matrix. Direct-current plasma was used in CVD synthesis. 20% of methane ($CH_4$) and 80% of hydrogen ($H_2$) were used as reaction gases. The synthesis of graphene was conducted under the conditions of a pressure of 1 Torr, a gas flow rate of 200 sccm, a matrix temperature of about 70° C. and a synthesis time of 30 minutes.

After the synthesis of graphene, a diamond matrix sample was collected and then observed by a high resolution transmission electron microscope (HRTEM). As a result, it was observed that the layers of graphene were vertically grown to a length of several nanometers (nm) while meeting with the surface of the matrix at an angle of 60°. When measured at a position spaced apart from the interface between diamond and graphene by 2 nm, the average interplanar spacing between the layers of graphene was 3.8 Å.

Example 2

Graphene was synthesized using a method shown in FIG. 3. First, a silicon substrate having a thickness of 1 mm was coated with a nanocrystalline diamond film using a direct-current plasma diamond synthesis apparatus. In this case, the coating of the silicon substrate was conducted under the conditions of a gas composition including 10% methane ($CH_4$) and 90% hydrogen ($H_2$), a pressure of 100 Torr, a gas flow rate of 200 sccm, a substrate temperature of about 70° C. and a synthesis time of 1 hour. The thickness of the nanocrystalline diamond film applied on the silicon substrate was 10 μm. As the results of Raman-analysis of the nanocrystalline diamond film, the nanocrystalline diamond film exhibited the properties of typical nanocrystalline diamond film.

Subsequently, an experiment for synthesizing graphene on the silicon substrate coated with the nanocrystalline diamond film was conducted. In this case, the synthesis of the graphene was conducted under the conditions of a gas composition including 50% methane ($CH_4$) and 50% hydrogen ($H_2$), a pressure of 50 Torr, a gas flow rate of 200 sccm, a nanocrystalline diamond film temperature of about 60° C. and a synthesis time of 10 minutes.

After the synthesis of graphene, a diamond matrix sample was observed by a high resolution transmission electron microscope (HRTEM). As a result, it was observed that the graphene was vertically grown to a length of subnanometer from the surface of the matrix. The average interplanar spacing between the layers of graphene was 3.8 Å.

Example 3

Graphene was synthesized using a method shown in FIG. 4. A nanocrystalline diamond film having a crystal grain size of 20~30 nm, a thickness of 10 μm and a diameter of 4 inches formed on a silicon substrate having a thickness of 1 mm, which was formed using the same method as in Example 2, was used as a matrix.

Silica spheres having a size of about 10 μm were closely placed on the nanocrystalline diamond film and then the synthesis of graphene was performed using a multi-cathode direct-current plasma diamond synthesis apparatus. In this case, the synthesis of the graphene was conducted under the conditions of a gas composition including 10% methane ($CH_4$) and 90% hydrogen ($H_2$), a pressure of 100 Torr, a gas flow rate of 200 sccm, a silica sphere surface temperature of about 700° C. and a synthesis time of 30 minutes.

Figure 5:
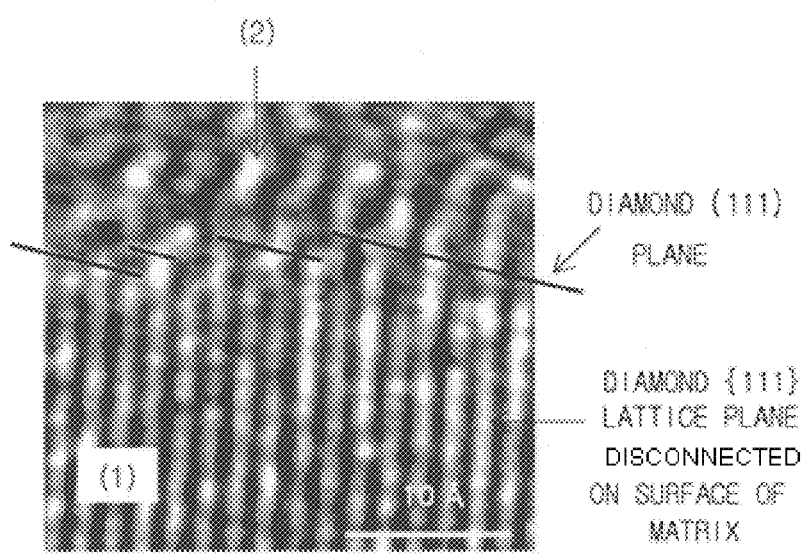
FIG. 5 is a high resolution transmission electron microscope (HRTEM) photograph showing a graphene-diamond hybrid material synthesized through the process as shown in FIG. 4, wherein a (111) plane crystallographically exists on the interface between diamond and graphene, and the layers of graphene meet with the (111) plane at an angle of 90° (refer to FIG. 1C).

After the synthesis of graphene, a sample was collected and then analyzed using a high resolution transmission electron microscope (HRTEM). As a result, as shown in FIG. 5, it was observed that layers of graphene were continuously synthesized along {111} lattice planes disconnected on the surface of the nanocrystalline diamond film at regular intervals. Therefore, it can be seen that this material is a hybrid material in which graphene phases are atomically bonded with diamond phases. The interplanar spacing between the {111} lattice planes disconnected on the surface of the nanocrystalline diamond film was about 2.06 Å, and the interplanar spacing between the layers of graphene was about 3.6~4.3 Å. The interplanar spacing between the {111} lattice planes was larger by 10~20% than the interplanar spacing (3.35 Å) of graphite.

In Example 3, graphene could be uniformly synthesized in a large area of 4 inches of diameter. From these results, it can be predicted that, when a commonly-used diamond synthesis apparatus [synthesis area: 8 inches of diameter (Microwave plasma CVD), 200 cm×100 cm (Hot filament CVD)] is used, it is possible to uniformly synthesize graphene in a large area of 8 inches or more in diameter.

Example 4

Graphene was synthesized for 10 hours using a matrix of Example 3 and using a method shown in FIG. 4 to obtain two samples. Among the two samples, one was a graphene-diamond hybrid material in which graphene having a length of about 1 μm was formed on a nanocrystalline diamond film, which is a matrix, as described in Example 3, and the other was a graphite nanoflake-silica sphere-diamond film composite in which a diamond film was deposited on a silica sphere layer formed on the matrix and graphite nanoflakes were deposited beneath the silica sphere layer.

This composite was a free-standing film separated from the matrix due to the difference in thermal expansion coefficient between the composite and matrix. The thickness of the composite was about 200 μm. As the result of observing this composite using a scanning electron microscope (SEM), it was found that a continuous diamond film through which grain boundaries appear was formed on the composite, contours of silica spheres were distinctively observed beneath the composite, and petal-shaped graphite nanoflakes were formed on the surface of the silica spheres along the contours thereof. A non-deposited portion having a diameter of several micrometers (μm) was observed at the central region of each of the silica spheres. This non-deposited portion is a portion in which graphite nanoflakes cannot be grown due to the contact of the silica spheres and the diamond matrix. Meanwhile, the electric properties of the composite were examined. As a result, the specific resistance of the graphite nanoflakes in the composite was about $10^{-3}$ Ω·cm, and the diamond film in the composite exhibited nonconductive properties.

Subsequently, the silica spheres were removed from the composite by immersing the composite into a silica etching solution (a boiling Murakami solution). That is, the silica etching solution infiltrated into the silica spheres through the non-deposited portion formed on the lower surface of the silica spheres, thus melting the silica spheres. Therefore, a diamond film-graphite nanoflake hybrid film having a diameter of 4 inches was obtained in the form of a free-standing film.

As the result of analysis of the hybrid film using a transmission electron microscope (TEM), graphene was observed on the interface between the diamond film and graphite nanoflakes. Therefore, it can be seen that this hybrid film is composed of diamond, graphene and graphite nanoflakes. Further, from this result, it can be seen that a diamond film-graphene hybrid film can also be obtained in the form of a free-standing film depending on the change in synthesis conditions.

Example 5

Graphene was synthesized according to the same method as in Example 3 using a (111) monocrystalline silicon substrate having a thickness of 1 mm as a matrix.

After the synthesis of graphene, a sample was collected and then analyzed using a transmission electron microscope (TEM). As a result, layers of graphene were continuously deposited along silicon {111} lattice planes disconnected on the surface of the monocrystalline silicon substrate. The ratio of the silicon {111} lattice plane to graphene was partially 1:1 and 2:1, and the average interplanar spacing between the layers of graphene was about 3.8 Å. Therefore, it can be seen that a graphene-silicon hybrid material can be synthesized.

As described above, according to the present invention, graphene can be epitaxially grown in a small molecular size along lattice planes disconnected on the surface of a matrix using a CVD carbon material synthesis method, and can be synthesized in a large area of 8 inches or more in diameter.

While the invention has been shown and described with respect to the preferred embodiments, it will be understood by those skilled in the art that various changes and modifications may be made without departing from the spirit and scope of the invention as defined in the following claims.

What is claimed is:

1. An AA graphene-diamond hybrid material, comprising:
   a diamond matrix having edges of disconnected {111} lattice planes on the surface thereof; and
   AA graphene layers epitaxially grown on the edges of the {111} lattice planes.

2. The AA graphene-diamond hybrid material according to claim 1, wherein the diamond matrix is a monocrystalline plate or a polycrystalline diamond film.

3. The AA graphene-diamond hybrid material according to claim 1, wherein the diamond matrix is a free-standing film or a film coated on a substrate.

4. A method for preparing the graphene hybrid material of claim 1, comprising:
   epitaxially growing layers of graphene such that the layers of graphene are vertically oriented to a matrix along lattice planes disconnected on a surface of the matrix using a chemical vapor deposition (CVD) method in which the matrix provided on the surface thereof with the disconnected lattice planes where the layers of graphene are epitaxially grown is brought into contact with hydrocarbon and hydrogen gases.

5. The method for preparing the graphene hybrid material according to claim 4, wherein the chemical vapor deposition (CVD) method is conducted at a temperature of 500~800° C. and a pressure of 10 mTorr~40 Torr.

6. The method for preparing the graphene hybrid material according to claim 4, further comprising:
   forming one or more dummy particle layers including dummy particles which do not react with the matrix on the surface of the matrix.

7. The method for preparing the graphene hybrid material according to claim 6, wherein the dummy particles are spherical silica particles.

8. The method for preparing the graphene hybrid material according to claim 6, wherein the chemical vapor deposition (CVD) method is conducted at a temperature of 700~900° C. and a pressure of 40~200 Torr.

9. The method for preparing the graphene hybrid material according to claim 8, wherein, while the layers of graphene are grown, a diamond film is formed on the dummy particle layer, and carbon nanomaterials are synthesized beneath the dummy particle layer.

10. The method for preparing the graphene hybrid material according to claim 9, wherein the carbon nanomaterials are graphite nanoflakes, carbon nanotubes, carbon nanospheres, graphene, or mixtures thereof.

11. The method for preparing the graphene hybrid material according to claim 9, wherein a carbon nanomaterial-dummy particle layer-diamond film composite is obtained together with the graphene hybrid material by separating the dummy particle layer on which the diamond film and carbon nanomaterials are formed from the matrix on which the layers of graphene are formed, after the layers of graphene are completely grown.

12. The method for preparing the graphene hybrid material according to claim 11, wherein a carbon nanomaterial-diamond film hybrid material is obtained by removing the dummy particle layer from the carbon nanomaterial-dummy particle layer-diamond film composite using an etching solution.

* * * * *